(12) United States Patent
Jaakkola et al.

(10) Patent No.: US 9,071,226 B2
(45) Date of Patent: Jun. 30, 2015

(54) MICROMECHANICAL RESONATOR AND METHOD FOR MANUFACTURING THEREOF

(75) Inventors: Antti Jaakkola, Vtt (FI); Tuomas Pensala, Helsinki (FI)

(73) Assignee: Teknologian Tutkimuskeskus VTT (FI)

( * ) Notice: Subject to any disclaimer, the term of this patent is extended or adjusted under 35 U.S.C. 154(b) by 51 days.

(21) Appl. No.: 13/816,493

(22) PCT Filed: Aug. 11, 2011

(86) PCT No.: PCT/FI2011/050710
§ 371 (c)(1),
(2), (4) Date: Mar. 12, 2013

(87) PCT Pub. No.: WO2012/020172
PCT Pub. Date: Feb. 16, 2012

(65) Prior Publication Data
US 2013/0187724 A1   Jul. 25, 2013

(30) Foreign Application Priority Data
Aug. 13, 2010   (FI) ..................... 20105851

(51) Int. Cl.
*H03H 3/013* (2006.01)
*H03H 9/19* (2006.01)
(Continued)

(52) U.S. Cl.
CPC . *H03H 9/19* (2013.01); *Y10T 29/41* (2015.01); *H03H 9/02448* (2013.01); *H03H 2009/02496* (2013.01); *H03H 2009/2442* (2013.01); *H03H 2009/02511* (2013.01); *H03H 2009/02519* (2013.01); *H03H 3/013* (2013.01)

(58) Field of Classification Search
USPC ........... 331/107 R, 116 R, 154, 158; 333/200
See application file for complete search history.

(56) References Cited

U.S. PATENT DOCUMENTS

| 4,719,383 A | 1/1988 | Wang et al. |
| 2005/0262944 A1 | 12/2005 | Bennett et al. |

(Continued)

FOREIGN PATENT DOCUMENTS

| WO | WO 2008/013982 | 1/2008 |
| WO | WO 2010/044058 | 4/2010 |

OTHER PUBLICATIONS

Blom, et al.; "Thin-film ZnO as Micromechanical Actuator at Low Frequencies"; Actuator's A.; Feb. 1990, vol. 21., No. 1-3, pp. 226-228.

(Continued)

*Primary Examiner* — Joseph Chang
*Assistant Examiner* — Jeffrey Shin

(57) ABSTRACT

The invention relates to a temperature compensated micromechanical resonator and method of manufacturing thereof. The resonator comprises a resonator element comprising a semiconductor crystal structure, which is doped so as to reduce its temperature coefficient of frequency, transducer means for exciting to the resonator element a vibrational mode. According to the invention the crystal orientation and shape of the resonator element are chosen to allow for a shear mode having a saddle point to be excited to the resonator element, and said transducer means are adapted to excite said shear mode to the resonator element. Accurate micromechanical resonators with now temperature drift can be achieved by means of the invention.

18 Claims, 10 Drawing Sheets

(51) Int. Cl.
*H03H 9/02* (2006.01)
*H03H 9/24* (2006.01)

(56) References Cited

U.S. PATENT DOCUMENTS

| | | |
|---|---|---|
| 2006/0017523 A1 | 1/2006 | Bhave et al. |
| 2010/0127596 A1 | 5/2010 | Ayazi et al. |
| 2011/0074247 A1* | 3/2011 | Hohlfeld et al. ............. 310/329 |
| 2011/0204999 A1* | 8/2011 | Phan Le et al. ............. 333/200 |

OTHER PUBLICATIONS

Corman, et al.; "Gas Damping of electrostatically excited resonators";Elsevier; Sensors Actuators A: physical 61, No. 1 (1997) pp. 249-255.

Hopcroft, et al.; "What is the Young's Modulus of Silicon?"; Journal of Microelectmechanical Systems, vol. 19; No. 3, Apr. 2010, vol. 19, No. 2, pp. 229-238.

Bourgeois, et al.; "Design of Resonators for the Determination of the Temperature Coefficients of Elastic Constants of Monocrystalline Silicon"; Frequency Control Symposium, 1997 IEEE International, May 28-30, 1997, pp. 791-799.

Hjort, et al.; "Review Article: Gallium arsenide as a mechanical material"; Journal of Micromechanics and Microengineering, vol. 4, No. 1, Mar. 1994, pp. 1-13.

Lin, et al.; "Electrostatically Transduced Face-Shear Mode Silicon MEMS Microresonator"; Frequency Control Symposium (FCS); 2010 IEEE International, Jun. 1-4, 2010, pp. 534-538.

Lucklum, et al.; "Multi-Mode Excitation of Electromagnectic-Acoustic Resonant Senor Arrays;" Institute for Microelectronics and Microsensors; 2008 IEEE International, May 19-21, 2008.

Lucklum, et al.; "Electromagnetic-Acoustic High-Q Silicon Resonators for Liquid Phase Sensing"; IEEE Transactions on Ultrasonics, Ferroelectrics and Frequency Control; vol. 57, No. 5, May 2010.

Mattila et al.; "Silicon Micromechanical Resonators for RF-Applications"; IOP science; 2004 Phys. Scr. 2004. 181-183.

Samarao, et al.; "Passive TCF Compensation in High Q Silicon Micromechanical Resonators"; IEEE International Conference on Micro Electro Mechanical Systems (MEMS 2010), 2010, pp. 116-119.

Samarao, et al.; "Temperature Compensation of Silicon Micromechanical Resonators via Degenerate Doping"; Electron Devices Meeting (IEDM), Dec. 7-9, 2009 IEEE International, pp. 1-4.

Water et al; Design and operation of silicon ring resonator for force sensing applications above 1 $MH_z$; J. Micromech. Microeng. Nov. 2009, vol. 19, No. 11, pp. 1-7.

Wang, et al.; "Sputtered C-Axis Inclined Piezoelectric Films and Shear Wave Resonators"; Downloaded on Jun. 16, 2010; from IEEE.

PCT/FI2011/050710; filed Aug. 11, 2011; Teknologian Tutkimuskeskus VTT et al.; international search report dated Dec. 12, 2011.

Patentti-JA Rekisterihallitus; Finnish Search Report No. 20105851; dated Apr. 13, 2011.

* cited by examiner

MICROMECHANICAL RESONATOR AND METHOD FOR MANUFACTURING THEREOF

FIELD OF THE INVENTION

The invention relates to micromechanical resonators and a method for producing the same. In particular, the invention relates to temperature compensated silicon resonators according to the preamble of claim 1.

BACKGROUND OF THE INVENTION

Resonators are commonly used in electronics for providing a signal with accurate and stable frequency. The resonators are mostly made using quartz crystals, which have a good accuracy and temperature stability of frequency. However, the production process for producing crystal resonators is different from the process of producing most other electrical circuits, which are mainly produced of silicon. Therefore, the quartz crystal resonators are usually separate components, whereby separate phases are required in the production process of electronic devices.

The quartz crystal components also tend to be large in size. It would be desirable to provide MEMS resonators made of silicon or other semiconductor materials in order to facilitate integration with e.g. silicon based components.

One problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/C. This causes the resonance frequency to fluctuate due to changes in ambient temperature. It is possible to compensate the temperature dependence with a temperature sensor and related electronic control circuitry, but it has not been possible to provide a resonator with sufficiently low temperature drift with low cost technology which would be suitable for mass production applications and would compete with quartz quality. Also, the use of a temperature compensation circuit increases the consumption of energy, which is a significant disadvantage especially in battery operated devices. Further, the compensation circuit tends to increase electric noise in the resonator circuit. It is also possible to stabilize the temperature of the resonator with temperature isolation and active compensation, for example, controlled warming/cooling of the resonator. However, this solution also increases the energy consumption and noise of the device, and makes the device complicated to produce. The temperature compensation circuits are also slow in controlling, and cannot therefore compensate fast or large changes in ambient temperature sufficiently well. On the other hand, addition of amorphous SiO2 exhibiting opposite sign of temperature drift to the structure, as used in some prior art solutions, leads to a more complex fabrication process and resonator performance trade-off.

TCF in a silicon resonator in in-plane resonance modes has been recently studied e.g. in Lin, A. T.-H. et al, "*Electrostatically transduced face-shear mode silicon MEMS microresonator*", Frequency Control Symposium (FCS), 2010 IEEE International, Jun. 1-4, 2010, pp. 534-538, orally held on Jun. 6, 2010, published on Aug. 23, 2010.

Another problem associated with silicon based resonators relates to their actuation. In electrostatic actuation electrodes are placed on one or more sides of the resonator body in such a way that a narrow gap is formed in between the resonator body and the electrode. A voltage between the resonator and electrodes results in an electrostatic force, which can be used for driving square-extensional or Lamé resonance. For example, Mattila et al, "*Silicon Micromechanical Resonators for RF-Applications*", Physica Scripta. Vol. T114, 181-183, 2004, show an electrostatically actuated silicon resonator exhibiting square-extensional mode. However, to obtain strong enough electromechanical coupling, electrostatic actuation requires in general large (>20 V) bias voltages and narrow (<200 nm) gaps between a transducer element and the resonator. The bias and gap constraints are considerable disadvantages as concerns IC design and MEMS processing. In particular, the bias constraint is a complication for oscillator drive IC design, as low-cost processes are not compatible with voltages less than ~5V and the on-IC DC voltage generation is power consuming. The gap constraint is a process complication, because typical commercial MEMS processes are only capable of >=2 μm gaps. Narrow gaps are also an ESD risk, reducing device reliability.

J. S. Wang et al, "*Sputtered C-Axis Inclined Piezoelectric Films and Shear Wave Resonators*", Presented at *the 37th Frequency Control Symp., Philadelphia*, 1-3 Jun. 1983, 1983, 1-3, present that the p+-doped silicon appears to have positive temperature coefficient and in combination with ZnO and AlN films such silicon can be used for manufacturing inclined-angle shear mode resonators with an overall temperature coefficient near zero.

Lately it has been shown by A. K. Samarao et al, "*Passive TCF Compensation in High Q Silicon Micromechanical Resonators*," IEEE International Conference on Micro Electro Mechanical Systems (*MEMS* 2010), 2010, pp. 116-119, that heavy p-doping of silicon dramatically reduces the TCF of a Lamé resonance mode of a square plate resonator. This kind of compensation is also discussed by A. K. Samarao et al, Temperature compensation of silicon micromechanical resonators via degenerate doping, Electron Devices Meeting (IEDM), Dec. 7-9, 2009, IEEE International, IEEE, Piscataway, N.J., USA, pp. 1-4, published on Mar. 29, 2010.

US 2010/0127596 discloses a MEMS resonator which includes a boron-doped resonator region in order to reduce the TCF. The resonator may comprise a piezoelectric layer on top of the resonator and input/output electrodes on top of the piezoelectric layer. An alternative structure is disclosed in U.S. Pat. No. 4,719,383.

Beam resonators are also known which oscillate in a torsional mode. Such resonators are known, for example from T. Corman et al., "*Gas damping of electrostatically excited resonators,*" Sensors and Actuators A: Physical 61, no. 1 (1997): 249-255. Such resonators can also be temperature compensated. However, it is not known how such resonators could be excited using a piezoelectric thin film. Due to certain design constraints associated with electrostatic excitation, piezoelectric excitation would, however, be a preferred option in many cases.

In addition to the specific disadvantages referred to above, the above-mentioned structures are complicated to manufacture or their temperature compensation is not at a desired level. Additionally, they are generally incapable of operating at low enough frequencies (down to 30 kHz). In particular, despite recent developments in passive temperature compensation by doping of silicon, new resonator designs which can better take advantage of the capabilities of doped silicon are needed.

SUMMARY OF THE INVENTION

It is an aim of the invention to provide a novel passively temperature compensated semiconductor resonator overcoming at least some of the above-mentioned problems.

A particular aim is to provide a novel shear mode resonator which can better take advantage of the TCF-reducing property of doped resonators.

The invention is based on the idea of utilizing a resonator element and transducer means which are adapted to produce to the resonator element a shear resonance mode having a saddle point.

More specifically, the resonator according to the invention comprises the features of claim 1 and the method the features of claim 16.

The resonator element is typically a plate having the shape of a square, rectangle, polygon or a circular or elliptical disk. Alternatively, the resonator element can be any asymmetric structure to which a resonance mode having a saddle point can be excited.

According to one embodiment, there is provided a passively temperature compensated micromechanical resonator comprising a resonator element comprising a silicon crystal structure, which is doped, for example with boron, so as to reduce its temperature coefficient of frequency, and transducer means for exciting to the resonator element a vibrational mode. According to the invention, the crystal orientation and shape of the resonator element are chosen to allow for a saddle mode to be excited to the resonator element and the transducer means are adapted to excite said saddle mode to the resonator element.

Of particular importance are embodiments of the invention in which the shear wave mode comprises at least two nodal lines exhibiting no displacement during vibration and intersecting each other at said saddle point, and in which the resonator element is anchored to a substrate at points where the nodal lines meet the perimeter of the resonator. In particular, the nodal lines can be

- along the [100] crystal directions of the resonator element, when the element is manufactured on a (100) silicon wafer, or
- along the [110] and [100] crystal directions of the resonator element, when the element is manufactured on a (110) silicon wafer.

Generally speaking, the term "shear mode having a saddle point" refers to any mode, which exhibits shear waves propagating in the structure and comprising at least one static saddle point (no out-of-plane or in-plane displacement at this point during oscillation. In particular, such shear mode can be a flexural saddle mode.

The term "flexural saddle mode" refers to a mode in which the resonator element forms, at least in some phase of oscillation, a saddle surface around the saddle point. Thus, the resonator element is curved both "up and down", depending on a direction from the saddle point.

The desired resonance is preferably based on bulk acoustic shear waves within a resonator formed of single crystalline silicon.

The invention provides significant advantages. A saddle point-comprising shear mode excited into a doped resonator body exhibits a reduced TCF, whereby such resonator is a practical alternative for quartz crystals.

In addition, the resonance frequency of shear-wave saddle modes herein described depends essentially only from the $c_{44}$ elastic parameter of silicon. Such resonance modes therefore take full advantage of internal temperature compensation achieved by doping of silicon, as will be described below in more detail.

The expression that the resonance frequency is "dependent essentially only on the $c_{44}$ elastic parameter" means that the frequency does not significantly depend on other elastic parameters of the resonator material, such as $c_{11}$ and $c_{12}$ in the case of silicon. In particular, the contribution of non-$c_{44}$ elastic parameters to the resonance frequency should preferably be 20% at maximum. This is discussed later in more detail.

One particular advantage of the invention is that resonance mode having a saddle point can be excited to the resonator using piezoelectric transducing means, such as a piezoelectric thin film deposited on top of the resonator element. This is in contrast with for example torsional beam resonators, which cannot be excited in a similar way. Thus, disadvantages with regard to e.g. bias voltage requirements and gaps between the resonator element and transducers are completely avoided.

A saddle mode also inherently has nodal points at the perimeter of the resonator element which can be used as low-loss anchoring points.

The proposed structures are small and do not increase the complexity and noise level of the resonator, contrary to active means used for TCF compensation in some prior art solutions. In addition, the resonance frequency of the resonator can be relatively easily varied by changing the dimensions and/or shape of the resonator element, as discussed later in more detail. For example, the resonance frequency can be 30 kHz-5 MHz.

Further advantageous embodiments are the subject of the dependent claims.

Next, embodiments of the invention will be described in more detail with reference to the attached drawings.

DETAILED DESCRIPTION OF EMBODIMENTS

Figure 1A:
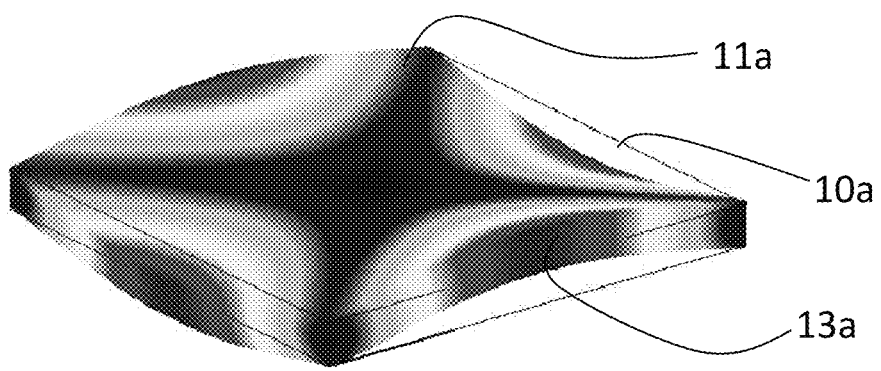
FIGS. 1*a* and 1*b* show a 3D graphs of two preferred resonator modeshapes according to the invention.

The invention is now described in more detail having particular focus on rectangular saddle mode resonators and shortly introducing other preferred shapes too. However, first the concept of $c_{44}$ dependency of the frequency of a resonator made of silicon and particular advantages of the invention with respect to temperature compensation are described in more detail.

The resonance frequency of a mode of a resonator having an arbitrary shape is, in a general form, given by $$f = A\frac{1}{L}\sqrt{\frac{c}{\rho}},$$ (Eq. A)

where c is a generalized elastic modulus of the material, ρ is the material density, and L is a generalized dimension of the resonator. For single crystal silicon, the elastic properties are given by three independent elastic parameters $c_{11}$, $c_{12}$ and $c_{44}$, and the generalized elastic modulus c is a function of the three elastic parameters $$c=c(c_{11},c_{12},c_{44}).$$ (Eq. B)

Importantly, constant A depends on the resonator geometry, on the resonator relative orientation with the silicon crystal axes, and on the particular resonance mode under investigation.

For silicon, the elastic parameters are strongly temperature dependent (typically approximately −60 ppm/° C.). As a result, the resonance frequency changes with temperature (a minor contribution comes from thermal expansion, which affect both L and ρ). It has been found that the thermal dependency of $c_{44}$ can be reduced by heavily p-doping silicon with boron, i.e., $\partial c_{44}/\partial T$ gets very small compared to its original value with heavy concentration of boron. It has been also observed that $c_{11}$ and $c_{12}$ are less modified with boron doping.

To take full advantage of the above described phenomenon for the temperature compensation of a single crystal resonator, the resonance mode should be dependent only on $c_{44}$:

$$\partial f/\partial c_{11}=0, \partial f/\partial c_{12}=0 \text{ and } \partial f/\partial c_{44}\neq 0.$$ (Eq. C)

Such modes are, for example, the saddle mode of a thin plate resonator, provided that the alignment of the resonator with the crystal directions is suitably chosen.

In reality, due to design compromises and imperfect fabrication, there will always be some contribution from non-$c_{44}$ parameters too. However, it is preferred within this invention that:

$$|\partial f/\partial c_{11}|<0.20\times|\partial f/\partial c_{44}|$$

and $$|\partial f/\partial c_{12}|<0.20\times|\partial f/\partial c_{44}|$$

Thus, in general, a maximum of 20% contribution to the resonance frequency is allowed from each non-$c_{44}$ component. Designs with non-$c_{44}$ contributions of less than 10% and even less than 5% can, however, be feasibly implemented. An example of a design compromise can be the use of mass loading (discussed later in more detail) to decrease the resonance frequency: parts that bring additional mass to the system may also act as springs to some extent, and the vibration within these parts can consist of non-shear components which increases the non-$c_{44}$ components. An example of imperfect fabrication can be misalignment with crystal axes.

According to a preferred embodiment of the invention, a plate resonator design is provided, which is manufactured on a doped silicon wafer. The resonance mode is characterized by its symmetric saddle surface shape, where the center point of the plate is the saddle point. The frequency of the mode is dependent essentially only on the $c_{44}$-elasticity parameter, and therefore has a low temperature drift corresponding to that observed in higher-frequency shear modes. The resonator plate is anchored to the substrate from the four nodal points at its perimeter.

The resonance frequency of the resonator is dependent on its dimensions and mass. In a preferred design, the resonator has a resonance frequency of 30 kHz-5 MHz, typically 30 KHz 3 MHz. For example, the resonator element can be a square plate with a side length of for example 100-1000 μm. A typical side length is 320 μm. The thickness of the resonator element can be for example 5-100 μm. A typical thickness is 30 μm. For example, a frequency of about 2 MHz is achievable with typical square plate dimensions of 320×320×30 μm³. The resonance frequency can also be lowered by adding to the perimeter of the plate additional mass elements, as will be described below in more detail.

The wafer is preferably heavily p+-doped. The doping concentration in the resonator element is such that the temperature coefficient of frequency TCF of the resonance frequency of the plate is smaller in magnitude than 20 ppm/K, in particular smaller in magnitude than 10 ppm/K, preferably smaller in magnitude than 3 ppm/K. A suitable doping concentration is at least $10^{19}$ cm$^{-3}$, in particular $3*10^{19}$-$3*10^{20}$ cm$^{-3}$.

The doping agent can be boron or other suitable p+-type doping agent. The layer may also be doped with another doping agent, such as germanium, in order to reduce tensile stress which is caused by the p+ doping. It has been discovered that the doping with germanium also has an effect of reducing the second order temperature coefficient of the material compared to material with merely boron doping. This can be a significant feature in order to achieve accurate temperature compensation within a large temperature range.

It should be noted that in addition to the basic silicon material of the plate, the resonator may include also other structures which may have a negative temperature coefficient. Therefore, it is preferable to obtain by doping and possibly by other means such compensation to the temperature coefficient of the resonator plate that the total temperature coefficient of the resonance frequency of the resonator is close to zero. This may mean that the temperature coefficient of a separate resonator plate without other resonator structures would be slightly positive.

The temperature compensation of the resonator is preferably entirely passive, meaning that it is based on material and structural properties rather than feeding additional energy to the system to compensate for the temperature drift.

Numerical modal analysis shows that a square-shaped plate resonator can have a fundamental flexural (i.e., out-of-plane) mode that is dependent essentially only on the $c_{44}$ elastic parameter of the material concerned. The mode is characterized by its symmetric saddle shape, saddle point being at the center of the plate. Four nodal points exist at the plate perimeter, facilitating low loss anchoring of the resonator to the substrate at these nodal points.

Figure 1B:
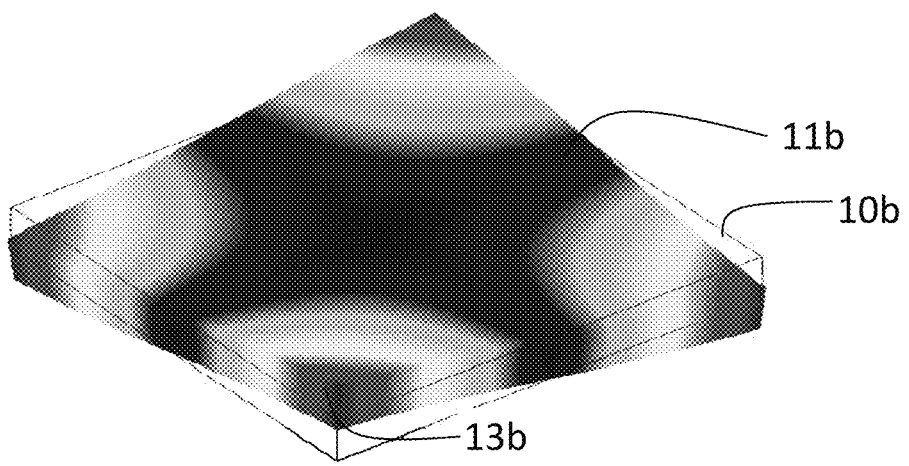
Figure 2A:
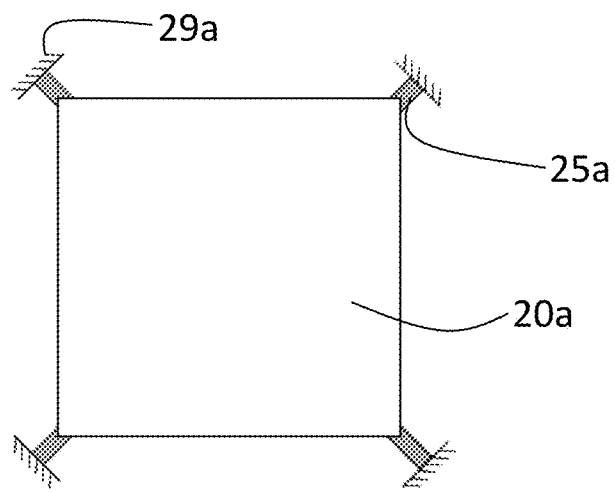
FIGS. 2*a* and 2*b* illustrate the resonator designs of FIGS. 1*a* and 1*b*, respectively, in top views.
Figure 2B:
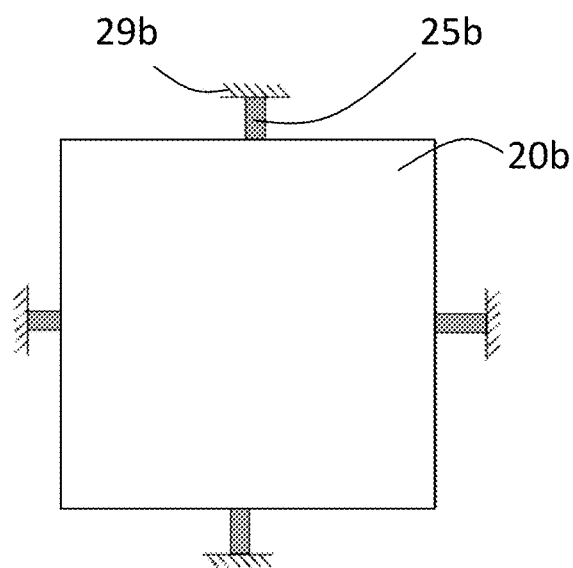

Turning now to the practical structures and geometries of the resonator, the existence of a particular mode and its exact modeshape and frequency are dependent on the plate orientation with respect to silicon crystal. Examples of two different saddle modes are shown in FIGS. 1a and 1b in a (100) oriented wafer 10a, 10b. As shown in FIGS. 2a and 2b, the anchoring of the plate 20a, 20b to the substrate 29a, 29b is realized using anchors 25a, 25b at the corners and at the middle point of the sides of the plate 20a, 20b, respectively.

FIGS. 1a and 2a show a case where a saddle mode exists in a square plate 10a, 20a whose sides are oriented along the [110] directions. In a 320×320×30 μm³ silicon plate, the fundamental resonance occurs at 2.3 MHz. Points of small displacement (no out-of-plane displacement) are denoted with a reference numeral 11a and dark (blue) color. Points of large displacement (significant out-of-plane displacement) are denoted with a reference numeral 13a. As can be seen from the FIG. 1a, a saddle surface is formed at the phase of oscillation shown.

FIGS. 1b and 2b show a case where a saddle mode exists in a square plate 10b, 20b whose sides are oriented along the [100] directions. In a 320×320×30 µm³ silicon plate, the fundamental resonance occurs at 1.6 MHz. Points of low displacement (no out-of-plane displacement) are denoted with a reference numeral 11b and dark (blue) color. Points of high displacement (significant out-of-plane displacement) are denoted with a reference numeral 13b. As can be seen from the FIG. 1b, a saddle surface is formed at the phase of oscillation shown.

In both cases, and also applying to a number of other plate geometries, the saddle point is located in the centre of symmetry of the resonator plate.

It should be noted that FIGS. 2a and 2b show the theoretical lowest-loss anchoring at the nodal points of the resonator element for the saddle modes in FIGS. 1a and 1b, respectively. Without departing from the general idea of the invention, the anchoring can take place at any other points of the resonator element too, although losses to the substrate structure may increase.

According to one preferred embodiment, the resonator element is a square plate fabricated on a (100) silicon wafer so that its sides are aligned with the [110] or [100] directions. This configuration allows for a saddle mode according FIGS. 1a and 1b to be operated.

Electrical coupling to the resonator can be achieved piezoelectrically, e.g. with patterns of piezoelectric thin film on top of the resonator, and metal as a top electrode. According to an alternative embodiment, electrical coupling is achieved electrostatically with electrodes patterned on an encapsulating layer above the resonator.

A total of four anchoring points also increase freedom in design: one can flexibly draw metal traces to the piezo top electrodes in a manner that optimizes the symmetry of the final design.

Figure 3A:
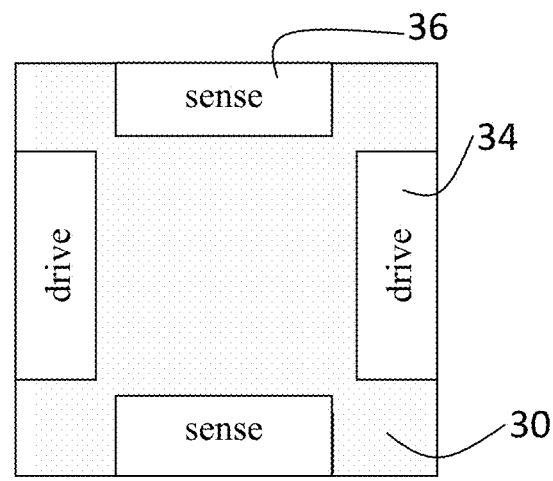
FIG. 3*a* shows a transducer arrangement according to one embodiment of the invention.

Electromechanical coupling to the resonance plate can be achieved with a suitably patterned piezoelectric thin film grown on top of the resonator plate. Metal electrodes can be applied on both sides (top and bottom) of the piezoelectric layer or the silicon layer may act as an electrode as it has been doped so as to be electrically conductive. FIG. 3a shows arrangement of thin film piezo transducers 34, 36 capable of exciting a saddle mode onto the resonator 30 (corresponding to FIGS. 1a and 2a). To minimize electrical feedthrough it is beneficial to separate drive transducers 34 and sense transducers 36 on different (rotated) 90° opposite sides of the plate in the presented manner.

Alternatively, electrostatic transduction can be employed to excite the resonance. Thus, electrodes with shapes similar to those in FIG. 3a can be patterned to an encapsulation layer (encapsulating wafer), onto the side which faces the resonator in such a manner that a (µm-range) gap is formed between the resonator and the electrodes. Coupling is achieved by a well known approach: a AC voltage signal is applied on top of a DC bias between the resonator plate and electrodes.

The resonator design according to FIGS. 1a, 2a and 3a has been simulated with Finite Element Method (FEM) using the harmonic analysis (frequency response) mode. The simulation indicates that the coupling efficiency is good: this is manifested by the relatively low value of electromechanical resistance: $R_m$~7 kΩ (assuming a quality factor Q of 10000, which has been shown very feasible in practice).

The importance of the above designs is further clarified by an example: to realize a simple (low-power) oscillator the feedthrough impedance $Z_0$ (coming mainly from the parasitic capacitances for this design) has to be much higher that $R_m$—a general rule of thumb is $Z_0/R_m$>10. Assuming a typical parasitic capacitance of 0.5 pF we get $Z_0/R_m$~30, which suggests that a practical oscillator circuit at least based on a piezocoupled saddle mode resonator at 2.3 MHz is well realizable.

As understood by a person skilled in the art, the transducers can act as a drive block, which means that when a voltage is applied force is exerted to the resonator plate. Alternatively, a transducers can have the role of a sense block, which means that if the during oscillation of the resonator, voltage is generated at the transducers. There may be provided one or more transducers of either purpose in the device separately or simultaneously, depending on its intended use. Moreover, when the resonator is electrically connected as a 1-port device, one transducer can act as a drive block and as sense block simultaneously.

FIGS. 4a-4d and 5a-5d show alternative geometries of the resonator element.

Figure 4A:
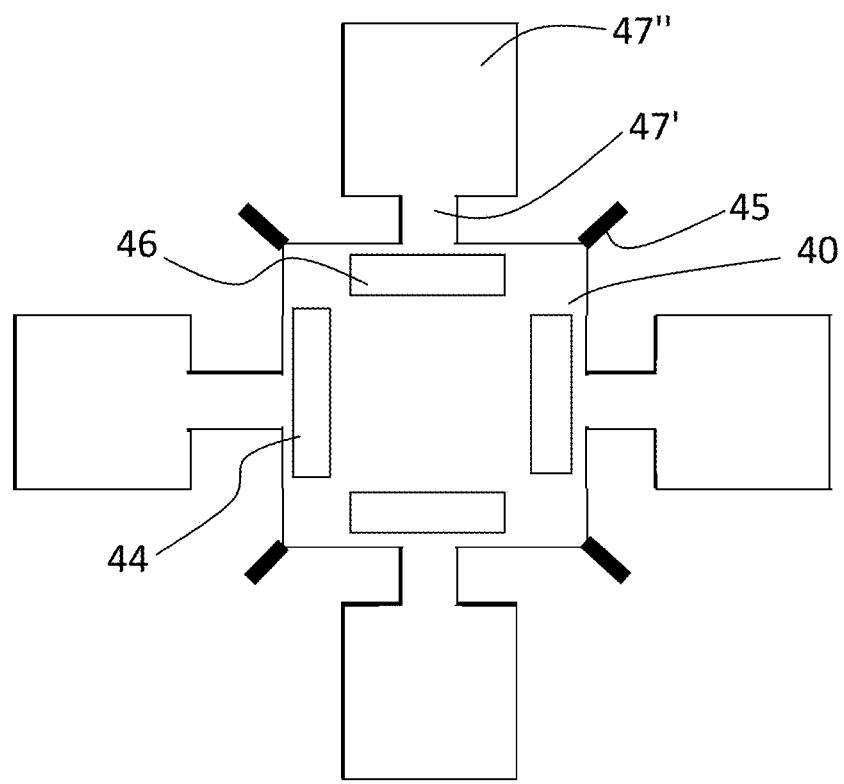
FIG. 4*a* shows a top view of a mass-loaded resonator according to one embodiment of the invention.

Referring to FIG. 4a, the resonator element may comprise a central element or resonator plate 40 and additional mass elements 47" arranged on four lateral sides thereof with suitable connectors 47'. The whole structure may be a single-crystal structure. The purpose of the additional mass elements 47" is to decrease the resonance frequency of the resonator (frequency proportional to sqrt(k/m), where k is the spring constant and m is mass of the resonance element). Anchoring 45 and transduction means can be provided to the central element 40 as discussed above with reference to FIGS. 1a, 2a and 3a. The central element 40 acts as a "spring" between the mass elements 47" and resonates in a saddle mode, dominated by the $c_{44}$ elastic term. The additional mass elements 47" should bring as little as possible spring effect to the system, whereby the resonance frequency decreases. Transducers 44, 46 can be placed on top of the central element 40 as shown in the figure, or on top of the mass elements 47".

Figure 4B:
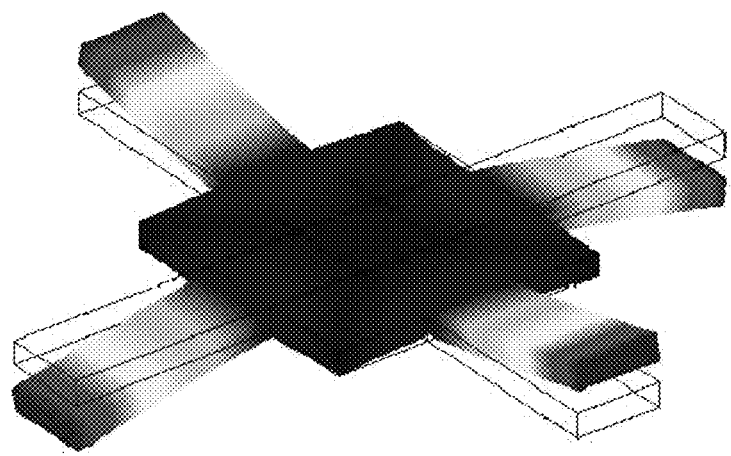
FIGS. 4*b*-4*d* show in perspective view FEM-simulated mass loaded resonators with different mass-loading configurations.
Figure 4C:
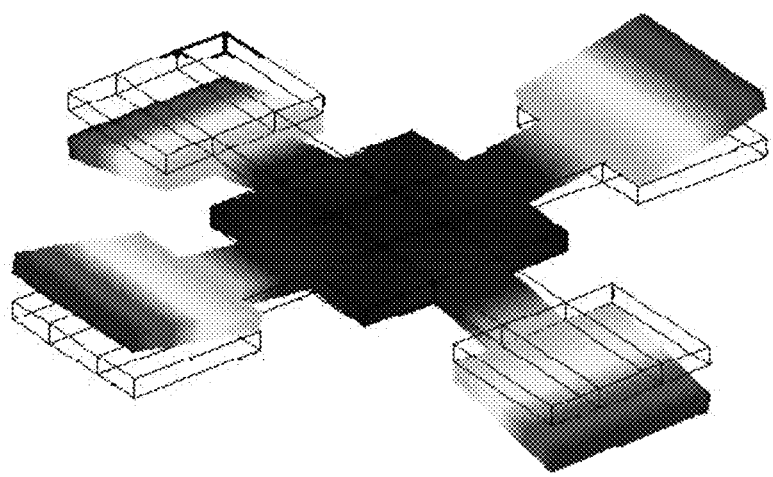
Figure 4D:
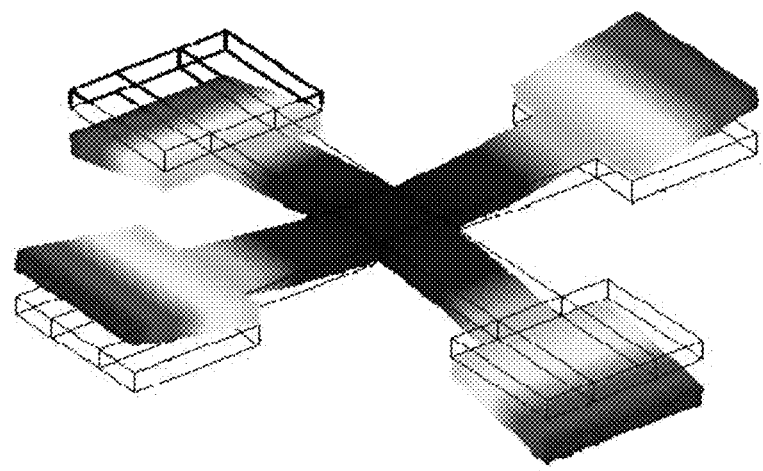

FIGS. 4b-4d show simulated behaviour of three mass-loaded resonators which have different ratios between the masses of the central element and the additional mass elements. In the case of FIG. 4b, the central portion is relatively large and relatively small-weight mass elements are attached to it, resulting in the decrease of the resonance frequency of the resonator from 1.9 MHz to 400 kHz, according to simulations. If the mass of the mass elements is further increased, as shown in FIG. 4c, the resonance frequency is further decreased to 100 kHz. Additional decrease in frequency can be obtained by making the resonator thinner.

Figure 5A:
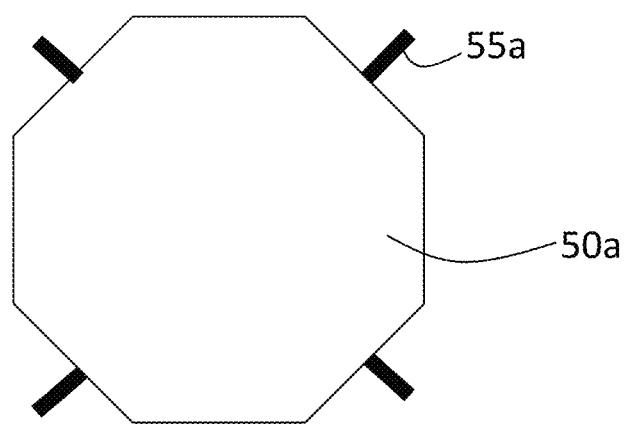
FIGS. 5*a* and 5*b* depict alternative resonator designs in top views.
Figure 5B:
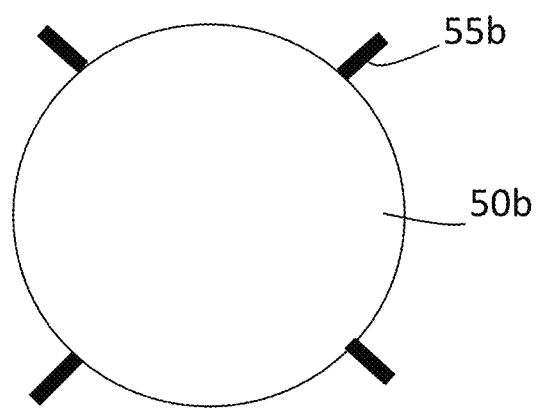

FIG. 5a shows a hexagonal resonator design with a hexagonal resonator plate 50a and four anchors 55a on four sides thereof. FIG. 5b shows a circular resonator design with a circular plate 50b and four anchors 55b symmetrically attached to it.

Figure 5C:
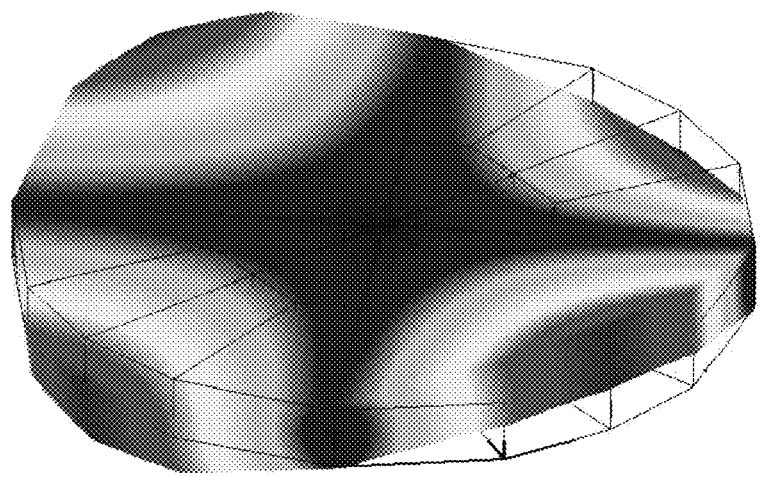
FIGS. 5*c* and 5*d* show in perspective views a FEM-simulated circular resonator plate and a mass-loaded circular resonator plate.
Figure 5D:
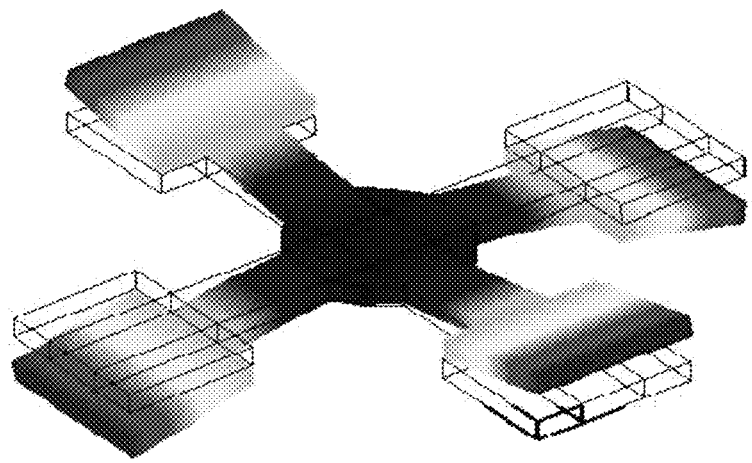

FIG. 5c shows a simulated circular resonator plate, clearly exhibiting a saddle mode at 2.5 MHz. FIG. 5d shows a circular resonator plate with additional mass elements, decreasing the resonance frequency of the resonator to 100 kHz.

In the examples of FIG. 5a-5d too, as well as in other geometries, the resonator element is preferably fabricated on a (100) silicon wafer so that their node lines are parallel to [100] crystal directions or on a (110) silicon wafer so that their node lines are parallel to [110] and [100] crystal directions of the resonator element.

Figure 7A:
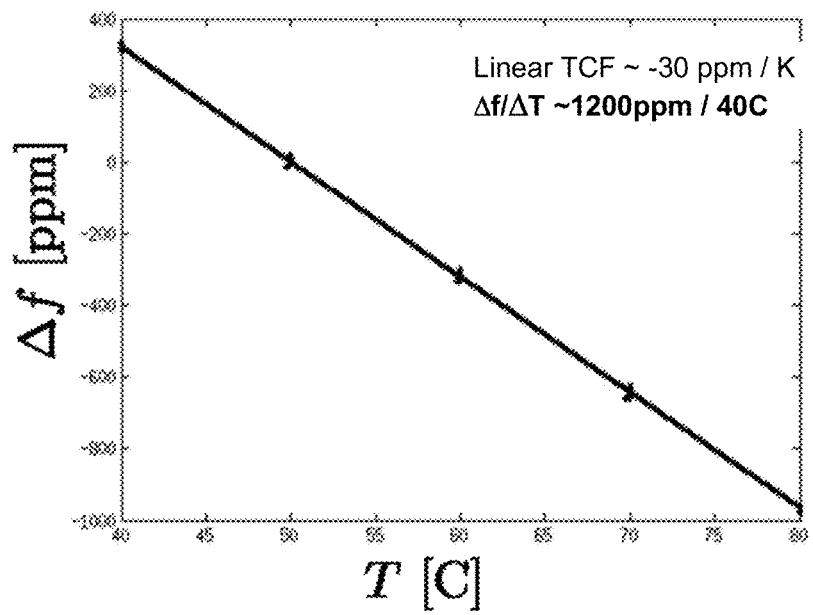
FIGS. 7*a* and 7*b* shows a typical temperature vs. frequency dependency of a pure silicon resonator and reduced temperature vs. frequency dependency of a strongly B-doped resonator, respectively.
Figure 7B:
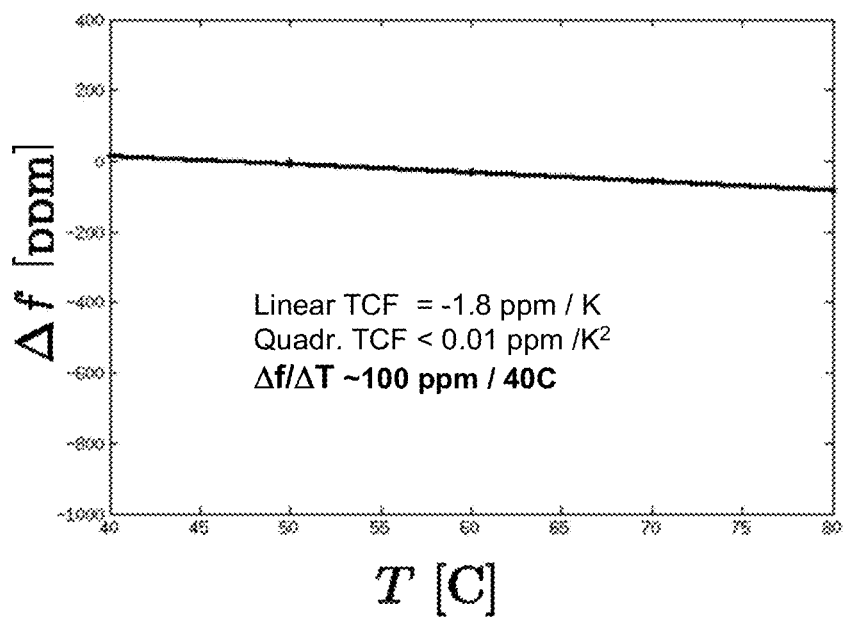

FIGS. 7a and 7b show temperature vs. frequency curves of a pure silicon and boron-doped silicon resonators. It can be seen, that the linear TCF of −30 ppm/K of the former has reduced to −1.8 ppm/K of the latter. This represents a huge improvement of the resonator for practical implementations. Using a flexural shear mode, in particular a saddle mode according to the invention provides a novel and inventive way obtaining such a reduced TCF in practice and thus a practical alternative for quartz crystals.

The present resonator structure can generally be manufactured by
- providing a semiconductor wafer having a doped device layer,
- forming from said device layer a resonator element,
- providing transducer means capable of exciting a flexural shear mode to the resonator element,
- wherein the crystal orientation of the semiconductor wafer and orientation of the resonator element are chosen allow said flexural shear mode.

Piezoelectrically coupled saddle mode resonators can be fabricated using a cavity-SOI (CSOI) based process. FIG. 6 illustrate in more detail CSOI processes for manufacturing a resonator structure of the present kind. In these examples, the SOI wafer is a Si—SiO2-(doped)Si wafer. The process comprises (1) providing an oxidized silicon wafer comprising a first silicon layer (handling layer) and a first oxide layer, (2) manufacturing a cavity into the first silicon layer through the first oxide layer and providing a second silicon layer (device layer) onto the first oxide layer, (3) providing a piezoactive layer (e.g. AlN) onto the second silicon layer aligned with the cavity, (4) oxidizing the free surface of the upper silicon layer to provide a second oxide layer, (5) locally removing the second oxide layer to locally expose the second silicon layer, (6) providing electrical conductors (e.g. Mo) on top of the second oxide layer to the piezoactive layer and to the exposed second silicon layer in order to be able to conduct electric potential through the piezoactive layer, (7) etching vertical cavities to the structure so as to separate the resonator element and piezotransducers suitably from surrounding structures, as described above.

A corresponding normal-SOI process comprises (1) providing a SOI wafer comprising a first silicon layer (handling layer), a first oxide layer and a second silicon layer (device layer), and providing a providing a local piezoactive layer (e.g. AlN) onto the second silicon layer, (2) oxidizing or depositing an oxide layer on the free surface of the upper silicon layer to provide a second oxide layer, (3) locally removing the second oxide layer to locally expose the second silicon layer, and in the case of deposited oxide, to expose also the piezoactive layer, (4) providing electrical conductors (e.g. Mo) on top of the second oxide layer to the piezoactive layer and to the exposed second silicon layer in order to be able to apply electric potential over the piezoactive layer, (5) etching vertical trenches to the structure so as to separate the resonator element and piezotransducers from surrounding structures, leaving only the so called anchors to support the resonator element, (6) etching horizontal cavities to the first oxide layer so as to separate the second silicon layer suitably from the first silicon layer.

Figure 6A:
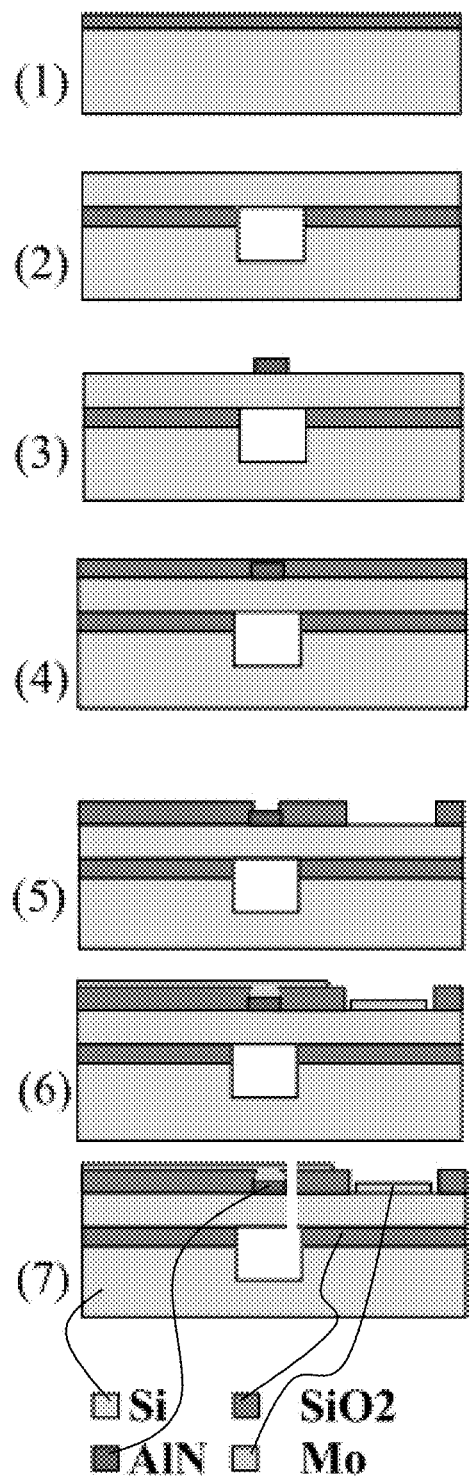
FIGS. 6*a* and 6*b* show in cross-sectional views exemplary manufacturing stages of a resonator according to the invention using a cavity-SOI and normal-SOI processes, respectively.
Figure 6B:
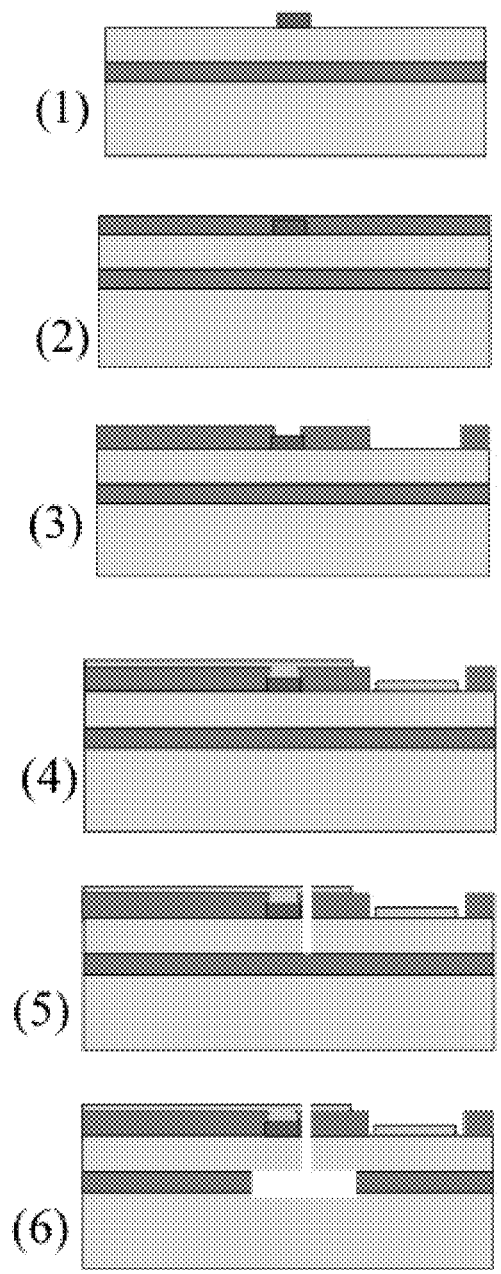

In FIGS. 6a and 6b, the trenches (release etching) are illustrated on the right hand side of the piezotransducer and cavity, whereas the structure at the location of anchors (non-releasing) is illustrated on the left hand side of the piezoactive layer and cavity.

If additional rigidity of the resonator is needed, a central nodal point (saddle point) mode can be used for anchoring the resonator to the substrate, e.g., using the buried-oxide layer of a SOI/cSOI wafer.

After SOI processing, the resonator structure is preferably vacuum encapsulated.

The invention claimed is:

1. A temperature compensated micromechanical resonator comprising
   a resonator element comprising a semiconductor crystal structure, which is doped so as to reduce its temperature coefficient of frequency, and
   transducer means for exciting to the resonator element a vibrational mode, wherein
   the crystal orientation and shape of the resonator element are chosen to allow for a shear mode having a saddle point to be excited to the resonator element, and
   said transducer means are adapted to excite said shear mode to the resonator element, wherein the transducer means comprises at least one piezoactive zone on the resonator element and adapted to subject a flexural perpendicular to the plane of the resonator element to the resonator element.

2. The resonator according to claim 1, wherein the shear mode is a flexural saddle mode.

3. The resonator according to claim 1, wherein the resonator element is anchored to its surrounding structures from one or more nodal points at the perimeter of the resonator element of the shear mode.

4. The resonator according to claim 1, wherein
   the shear mode comprises two nodal lines exhibiting no out-of plane displacement during vibration and intersecting each other at said saddle point,
   the resonator element is anchored to a substrate at one or more nodal points where the nodal lines meet the resonator perimeter.

5. The resonator according to claim 1, wherein the resonator element is manufactured
   on a silicon wafer and the nodal lines of said resonance mode are along the [100] crystal directions of the resonator element, or
   on a silicon wafer and the nodal lines of said resonance mode are along the [110] and [100] crystal directions of the resonator element.

6. The resonator according to claim 1, wherein the resonator element comprises a p+ doped silicon plate.

7. The resonator according to claim 1, wherein the resonator element comprises a square plate or a circular plate.

8. The resonator according to claim 1, wherein the resonator element is manufactured from a silicon wafer having a crystal orientation and
   at least one side of the resonator element is aligned along the [110] direction, or
   at least one side of the resonator element is aligned along the [100] direction.

9. The resonator according to claim 1, wherein the transducer means comprise at least one electrostatic transducer electrode placed at a distance from the resonator element and adapted to subject force perpendicular to the plane of the resonator element to the resonator element.

10. The resonator according to claim 8, wherein there are provided two or four electrostatic transducer electrodes or piezoactive zones on different sides of the resonator element.

11. The resonator according to claim 1, wherein the transducer means comprise at least one piezoactive block on a lateral side of the resonator element and adapted to subject a force perpendicular to the plane of the resonator element to the resonator element.

12. The resonator according to claim 1, wherein the resonance frequency of the shear mode is dependent essentially only on the $c_{44}$ elastic parameter of the resonator element, the contribution from other elastic parameters being less than 20%.

13. The resonator according to claim 1, wherein it comprises means for driving said transducer means, said means for driving being integrated to the same semiconductor structure as the resonator element and the transducer means.

14. The resonator structure according to claim 1, wherein in the resonator element comprises a rectangular plate anchored from its corners to a substrate.

15. The resonator structure according to claim 1, wherein the resonator element comprises a central element adapted to resonate in said shear mode and at least one additional mass element laterally attached to the central element for reducing the resonance frequency of the resonator.

16. The resonator structure according to claim 15, wherein the additional mass element(s) is/are dimensioned to reduce the resonance frequency of the resonator at least by a factor of 2 compared with a similar resonator without additional mass element(s).

17. The resonator structure according to claim 1, wherein the resonance frequency of the resonator is 30 kHz-5 MHz.

18. Method of manufacturing a passively temperature-compensated micromechanical resonator, comprising
providing a semiconductor wafer having a doped device layer,
forming a resonator element from said device layer, and
providing transducer means capable of exciting a vibrational mode to the resonator element, wherein the crystal orientation of the semiconductor wafer and shape of the resonator element are chosen allow a shear mode having a saddle point as said vibrational mode, and wherein the transducer means comprises at least one piezoactive zone on the resonator element and adapted to subject a flexural perpendicular to the plane of the resonator element to the resonator element.

* * * * *